US005990494A

United States Patent [19]

Seko et al.

[11] Patent Number: 5,990,494

[45] Date of Patent: *Nov. 23, 1999

[54] OPTOELECTRO TRANSDUCER ARRAY, AND LIGHT-EMITTING DEVICE ARRAY AND FABRICATION PROCESS THEREOF

[75] Inventors: Yasuji Seko; Akemi Murakami; Hiromi Otoma; Nobuaki Ueki; Mario Fuse, all of Ebina, Japan

[73] Assignee: Fuji Xerox Co., Ltd., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/827,358

[22] Filed: Mar. 27, 1997

[30] Foreign Application Priority Data

Mar. 28, 1996 [JP] Japan .................................... 8-074961

[51] Int. Cl.[6] ...................................................... H01L 33/00

[52] U.S. Cl. ................................. 257/88; 257/81; 257/82

[58] Field of Search ................................. 257/88, 98, 81, 257/91, 80, 82, 443; 372/50

[56] References Cited

U.S. PATENT DOCUMENTS 4,728,999 3/1988 Dannatt et al. ........................... 257/88

FOREIGN PATENT DOCUMENTS 59-164161 9/1984 Japan .
2-147259 6/1990 Japan .
5-94080 4/1993 Japan .

*Primary Examiner*—Minh Loan Tran
*Attorney, Agent, or Firm*—Oliff & Berridge, PLC

[57] ABSTRACT

Described is an optical equipment using a semiconductor light emitting device array which has light emitting points formed thereon at a high density and has highly reliability. The optical equipment according to the present invention features that it is equipped with a light emitting device array on which light emitting points LP have been arranged two-dimensionally, focusing means for focusing the light from the light emitting points, photo-detecting means which is disposed at the position where the light focused through the focusing means forms image formation points, and transferring means for transferring the image formation points relative to the photo-detecting means; said light-emitting device array being composed of a plurality of semiconductor chips and adjacent end surfaces of two semiconductor chips being bonded each other so as to have an inclination against the transferring direction.

6 Claims, 10 Drawing Sheets

Chip connection of semiconductor light emitting device array according to the present invention

OPTOELECTRO TRANSDUCER ARRAY, AND LIGHT-EMITTING DEVICE ARRAY AND FABRICATION PROCESS THEREOF

BACKGROUND OF THE INVENTION

1. Field of the Invention

This invention relates to a light equipment using a semiconductor light-emitting device array, particularly to a light equipment used for LED printer, laser printer, laser display, image sensor or the like.

2. Description of the Related Art

Conventional LED printers use as a light equipment a multi-tip head obtained by, as illustrated in FIG. 11, connecting rectangular LED light-emitting device chips Ch1 and Ch2 in a row, each of said chips having light emitting points LP arranged in one dimension.

Various methods have so far been proposed to attain high-density device arrangement. For example, proposed in Japanese Published Unexamined Patent Application No. Hei 2-147259 is a method in which chips having thereon light emitting points arranged in the staggered form are formed and then these chips are connected each other. In this method, light emitting points are arranged in the staggered form within one chip, which widens the distance between the two adjacent light emitting points and also widens the interconnection space, thereby bringing about an improvement in the yield. The end surface of the chip to be connected is parallel to the subsidiary scanning direction (the direction corresponding to the rotational direction of a drum in the surface of the LED chip) so that with an increase in the density of the light emitting points, the end surface of the chip becomes closer to the light emitting point. The distance between the end surface of the chip and the light emitting point include a margin of a predetermined value as shown in FIG. 12 because of the problem of the positional accuracy caused by chip cutting. It is necessary to provide several $\mu$m or greater for the distance between the light emitting point and the end surface to be cut in consideration of the damage caused by cutting. The scatter in the positional accuracy caused by chip cutting is ±5 $\mu$m or greater so that the scatter in the distance between the end surface and the light emitting point becomes 5–15 $\mu$m. If it is 15 $\mu$m, the distance between light emitting points becomes 30 $\mu$m when chips are connected, which makes it impossible to actualize a pitch of 21 $\mu$m for 1200 dpi.

In addition, disclosed in Japanese Published Unexamined Patent Application No. Hei 5-94080 is an optical head in which two rows of light-emitting devices are disposed, each of said devices being formed of an array light source obtained by successively connecting chips, and said two rows are disposed so that image formation points are arranged in a straight line on a photo-sensitive drum through rod lenses respectively corresponding to these two rows. It is only necessary to install, in each row, a light emitting point array having a light emitting point density half of the recording density. Owing to such low light emitting point density, the above optical head can be actualized easily. But, it is almost impossible to precisely align image formation points of each row from one end of the drum surface to the other end. In practice, it is very difficult to satisfy the severe demand for positional accuracy of light emitting points on the order of microns and moreover, this method is impractical because it takes a tremendous time and cost for the fabrication.

Moreover, Japanese Published Unexamined Patent Application No. Sho 59-164161 discloses a light-emitting diode array head in which the end surface of a semiconductor chip to be connected, said chip having light emitting diode rows which have been divided into at least two blocks in order to facilitate easy position control upon the connection of the light-emitting diode chips, is inclined at 5° from the original angle 90° relative to the light emitting diode rows.

By the technique described above, it becomes easier to carry out position control upon chip connection. If the light emitting diode rows are divided into two or more blocks, the electrode interconnection should be disposed on one side. In such a case, the higher the arrangement density of light emitting points, the higher the interconnection density, which makes it difficult to conduct wire bonding or the like. Accordingly, the above method is accompanied with the problem that it cannot be applied to a light emitting device array having a high light emitting point density. Besides, the blocks should be arranged in the staggered form from the viewpoint of the space of electrode interconnection of each block and it is substantially difficult to arrange the blocks in three or more lines. The above method is therefore accompanied with the problem that light emitting points cannot be two-dimensionally arranged freely.

As described above, in the conventional semiconductor device array of a multi-chip structure, the higher the device arrangement density in the chip connecting direction, the closer the distance between the end surface of the chip to be connected and the semiconductor device. Under the present situations, an error in the position accuracy caused by chip cutting or an error in the position accuracy caused by chip bonding is at least several $\mu$m so that when the cut end surface of the chip is vertical to the chip connecting direction, it is impossible to actualize the chip connection with light emitting points being arranged at high density such as 1200 dpi. Furthermore, when the device arrangement density becomes higher, it becomes impossible to secure an interconnection space or wire bonding space in the one-dimensional arrangement of light emitting points. Accordingly, there is a demand for the two-dimensional arrangement of light emitting points, thereby widening the distance between the light emitting points.

SUMMARY OF THE INVENTION

The present invention has been completed with the forgoing in view. An object of the present invention is to provide an optical equipment using a semiconductor light emitting device array which has light emitting points arranged at high density in the chip connecting direction and is highly reliable.

In one aspect of the present invention, there is thus provided a semiconductor light emitting device array, which is used for a light equipment equipped with the light emitting device array which emits light from a plurality of light emitting portions, photo-detecting means to which light is irradiated from said light emitting device array and transferring means for transferring the position of the light irradiated from said light emitting device array to a predetermined direction relative to said photo-detecting means;

- said light emitting device array being formed by adjacently disposing a plurality of semiconductor chips having light emitting portions formed thereon in a direction vertical to said predetermined direction,
- said plurality of light emitting portions being arranged two-dimensionally so that said portions have a first region positioned on a straight line vertical to said predetermined direction and a second region which is positioned between two adjacent light emitting portions in said first region in the vertical direction to said predetermined direction but is positioned not on said straight line; and adjacent end surfaces of any two of said adjacently disposed semiconductor chips being arranged so that they are inclined relative to said predetermined direction.

In a second aspect of the present invention, there is also provided an optical equipment, which is equipped with a light emitting device array, photo-detecting means to which light is irradiated from said light emitting device array and transferring means for transferring the position of the light irradiated from said light emitting device array to a predetermined direction relative to said photo-detecting means;

said light emitting device array being formed by adjacently disposing a plurality of semiconductor chips having light emitting portions formed thereon in a vertical direction to said predetermined direction, said plurality of light emitting portions being arranged two-dimensionally so that said portions have a first region positioned on a straight line vertical to said predetermined direction and a second region which is positioned between two adjacent light emitting portions in said first region in the vertical direction to said predetermined direction but is positioned not on said straight line; and adjacent end surfaces of any two of said adjacently disposed semiconductor chips being arranged so that they are inclined relative to said predetermined direction.

In a third aspect of the present invention, there is also provided an optoelectro transducer array having a plurality of two-dimensionally arranged optoeletro transducing portions, said optoelectro transducer array being formed by arranging a plurality of semiconductor chips having said optoelectro transducing portions thereon in a main arrangement direction, said plurality of optoelectro transducing portions being arranged two-dimensionally so that said portions have a first region positioned on a straight line vertical to said predetermined direction and a second region which is positioned between two adjacent light emitting portions in said first region in the vertical direction to said predetermined direction but is positioned not on said straight line; and adjacent end surfaces of any two of said adjacently disposed semiconductor chips being arranged so that they are inclined relative to said main arrangement direction of said optoelectro transducing portions.

In a fourth aspect of the present invention, there is also provided a process for fabricating a semiconductor light emitting device array, which comprises:

a light emitting device substrate forming step for forming a light emitting device substrate having a plurality of light emitting portions on the surface of a semiconductor substrate, a light emitting device chip forming step for forming a light emitting device chips each having a plurality of light emitting portions by dicing said light emitting device substrate at a desired position, and a light emitting device chip connecting step for arranging and tightly adhering said light emitting device chips onto a support substrate in a predetermined direction, said light emitting device chip forming step including a step of arranging said plurality of light emitting portions two-dimensionally so that said portions have a first region positioned on a straight line vertical to said predetermined direction and a second region which is positioned between two adjacent light emitting portions in said first region in the vertical direction to said predetermined direction but is positioned not on said straight line; and said semiconductor device chip connecting step including a step of carrying out dicing and connection so that adjacent end surfaces of two adjacently disposed semiconductor chips are inclined relative to said predetermined direction.

According to the above-described constitution, it is possible to widen the distance between the most proximate light emitting points while maintaining the arrangement density of the light emitting points in the main scanning direction under desired conditions.

In addition, by using a line—which bisects a line connecting the most proximate lighting points and at the same time, is substantially parallel to the arrangement of light emitting points—as an end surface of the chip to be connected, the distance between the light emitting point and the end surface of the chip can be widened to an extent that an error caused by chip cutting becomes negligible, whereby high density arrangement in the main scanning direction can be actualized.

The distance between the most proximate lighting points of the adjacent chips can be widened so that the margin at the chip cutting position can be increased and at the same time, the margin upon chip bonding can also be increased.

The distance from the chip end surface to the light emitting point can be widened so that the damage caused by chip cutting can be suppressed to the minimum.

Moreover, it is possible to actualize a multi-chip semiconductor array device on which light emitting points have been arranged at high density in the main scanning direction.

According to the constitution of the present invention, the distance between the most proximate light emitting points within one chip can be widened, which makes it possible to widen a space for an electrode, thereby facilitating easy formation of the electrode and accomplishing a high yield. Besides, heat radiation in the vicinity of light emitting points can be improved so that the deterioration of the semiconductor device can be lowered.

By changing the size of the chip as needed, the number of the devices disposed within the chip can be changed, which makes it possible to easily select a chip size having a high non-defective yield.

In addition, since the size of the chip can be changed freely, the size can be determined so as to heighten the yield of the semiconductor device in the chip, whereby cost reduction can be effected.

Incidentally, the above-described constitution can be applied not only to light emitting points but also photo-detecting points. In short, it is possible to apply it to an optoelectro transducer array equipment on which optoelectro transducing portions have been arranged.

By forming the one-dimensional arrangement, out of two-dimensional arrangement of image formation points projected on an axis which seems to be vertical to the relative transferring direction of the image formation points, to have a fixed cycle, a light equipment having substantially high density and high reliability can be obtained.

Moreover, it is possible to separately dispose the electrodes for supplying each light emitting device with electric current on both sides of the light emitting point arrangement.

Incidentally, in the optical equipment according to the present invention, by constituting image forming means from a field lens which includes all the rays from light emitting device array within its aperture and also from an image forming lens for carrying out image formation with accuracy, a light equipment having higher accuracy and higher reliability can be obtained.

It is also possible to constitute the image forming means from a micro lens array.

Further, a photosensitive drum can be used as the means for receiving the light of image-formation signal and the transfer of the image formation points may be achieved by the rotation of the drum.

Transfer of the image formation points can also be attained by a beam scanning mechanism.

According to the present invention, the distance to the proximate light emitting point can be widened, while maintaining the arrangement density of light emitting points in the main scanning direction under desired conditions.

Furthermore, it is possible to widen the distance from the light emitting point to the end surface of the chip to an extent that an error caused by chip cutting is negligible, thereby actualizing high density arrangement in the main scanning direction, by using a straight line which bisects a line connecting the most proximate light emitting points and at the same time is substantially parallel to the arrangement of light emitting points.

DETAILED DESCRIPTION OF THE PREFERRED EMBODIMENTS

The present invention will hereinafter be described more specifically with reference to the accompanying drawings.

Figure 1:
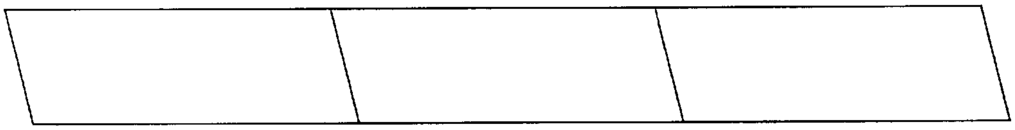
FIG. 1 is a schematic view of a surface light emitting type laser array apparatus for use in an optical equipment of one embodiment of the present invention.
Figure 2:
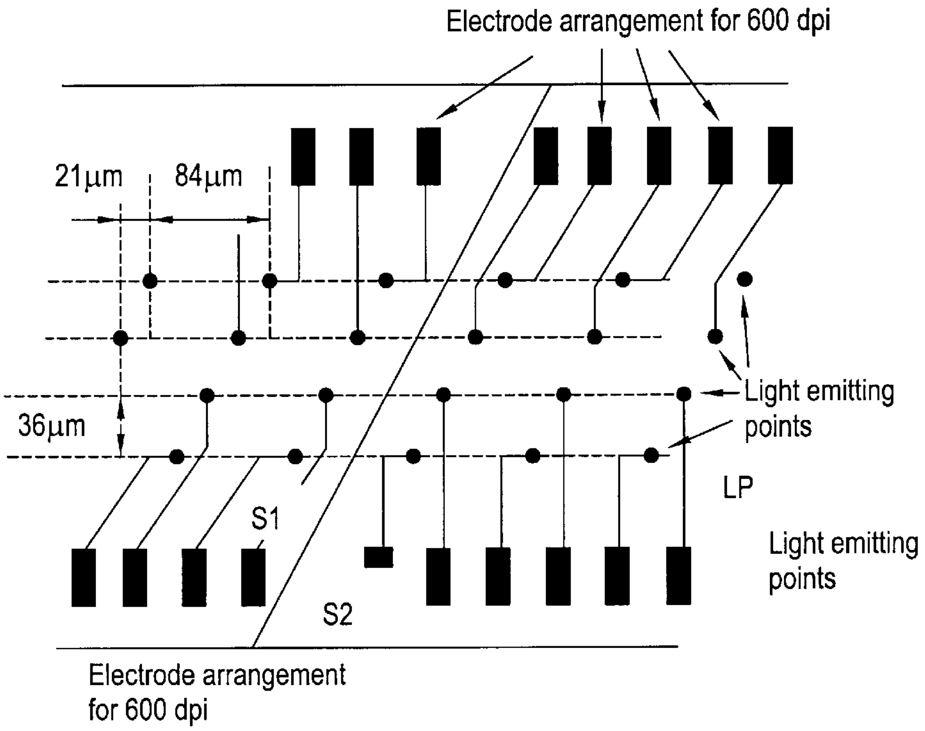
FIG. 2 is an enlarged view of the apparatus.
Figure 3:
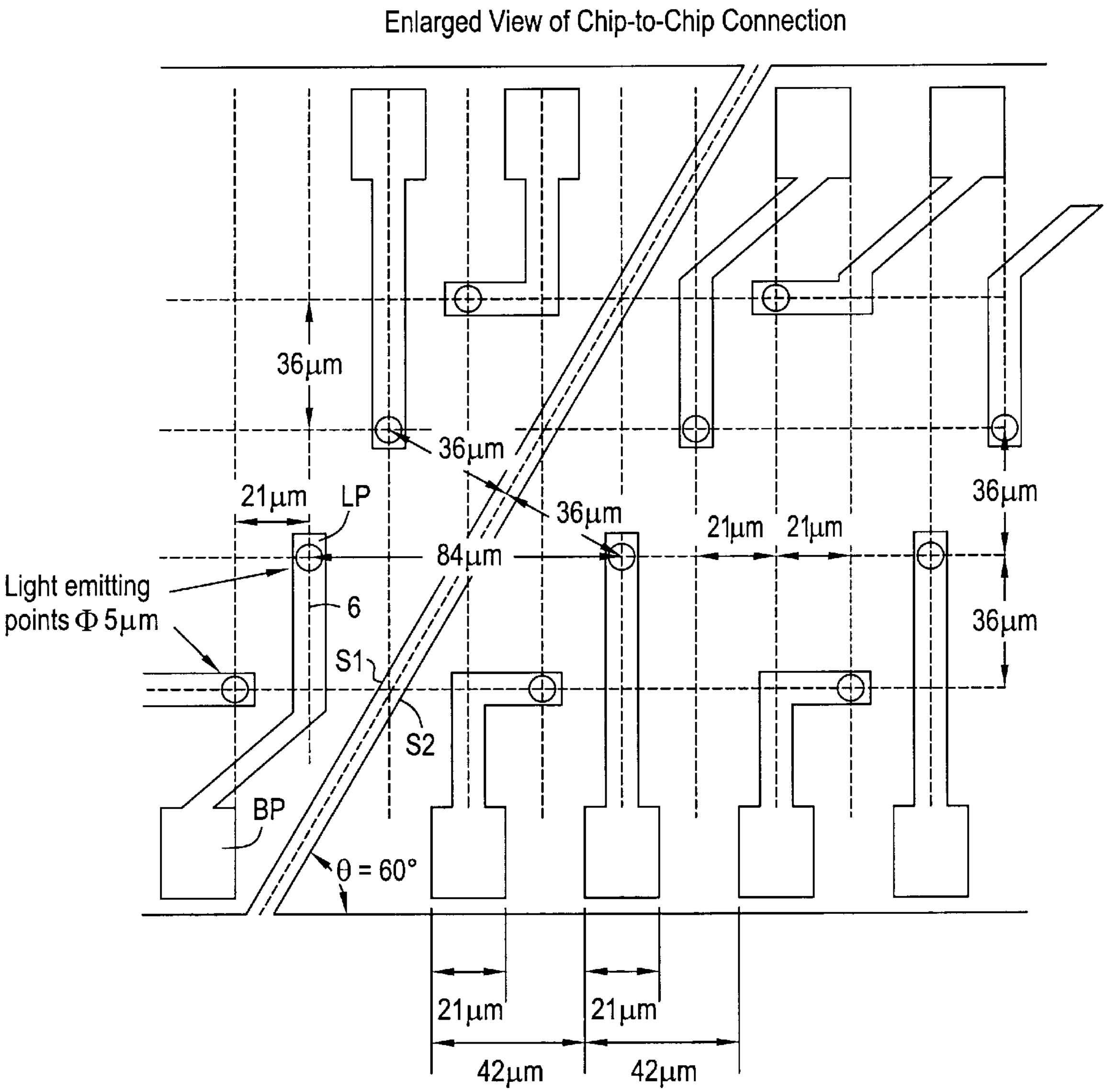
FIG. 3 is a plane view of the apparatus.
Figure 4A:
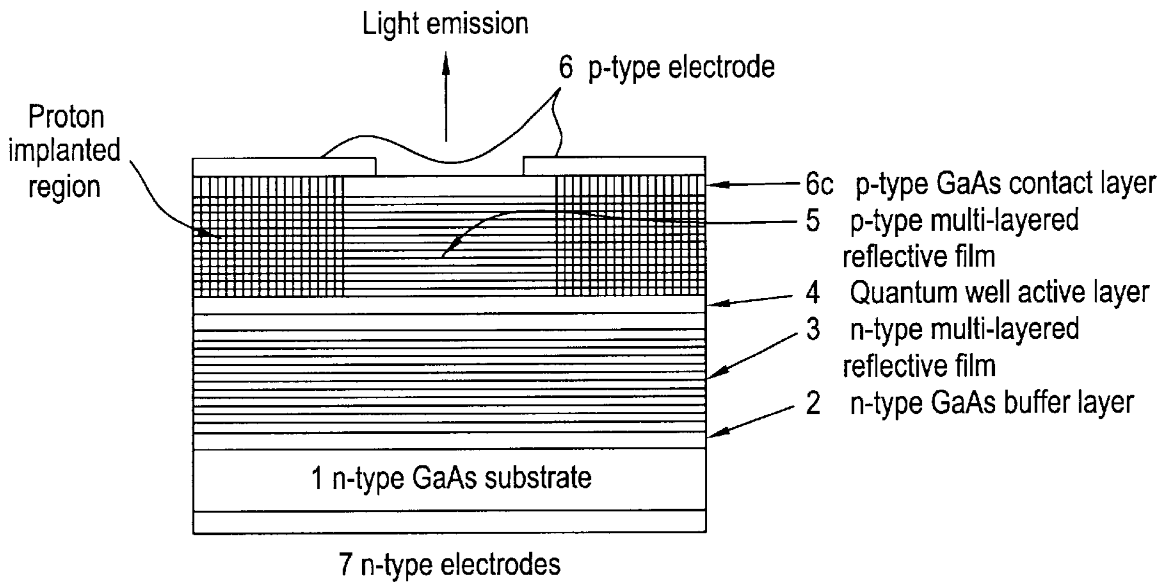
FIGS. 4(*a*) and 4(*b*) are fragmentary cross-sectional and top views of the apparatus.
Figure 4B:
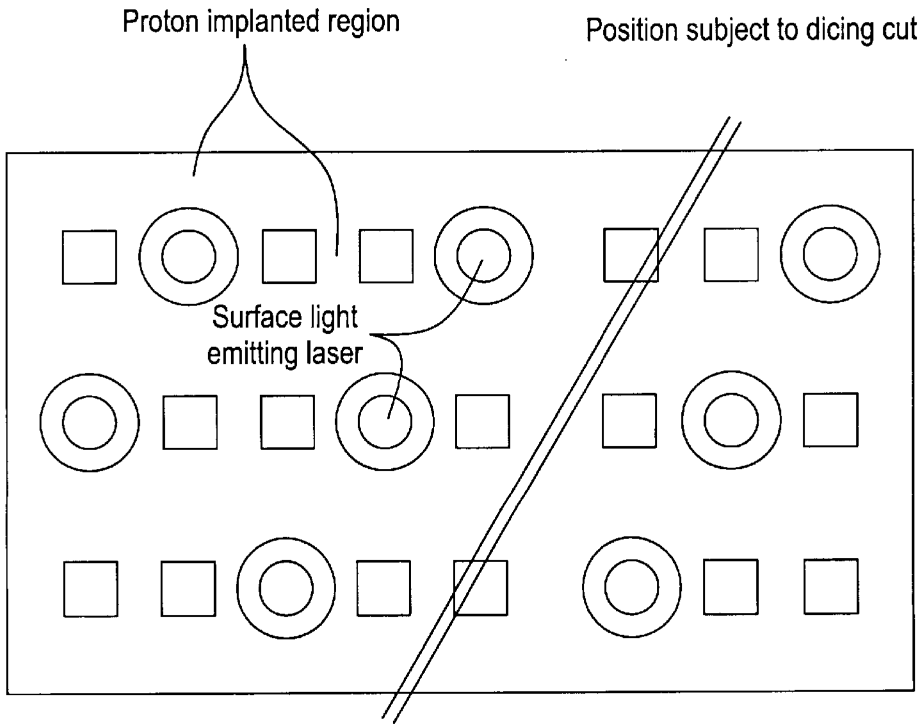
Figure 5:
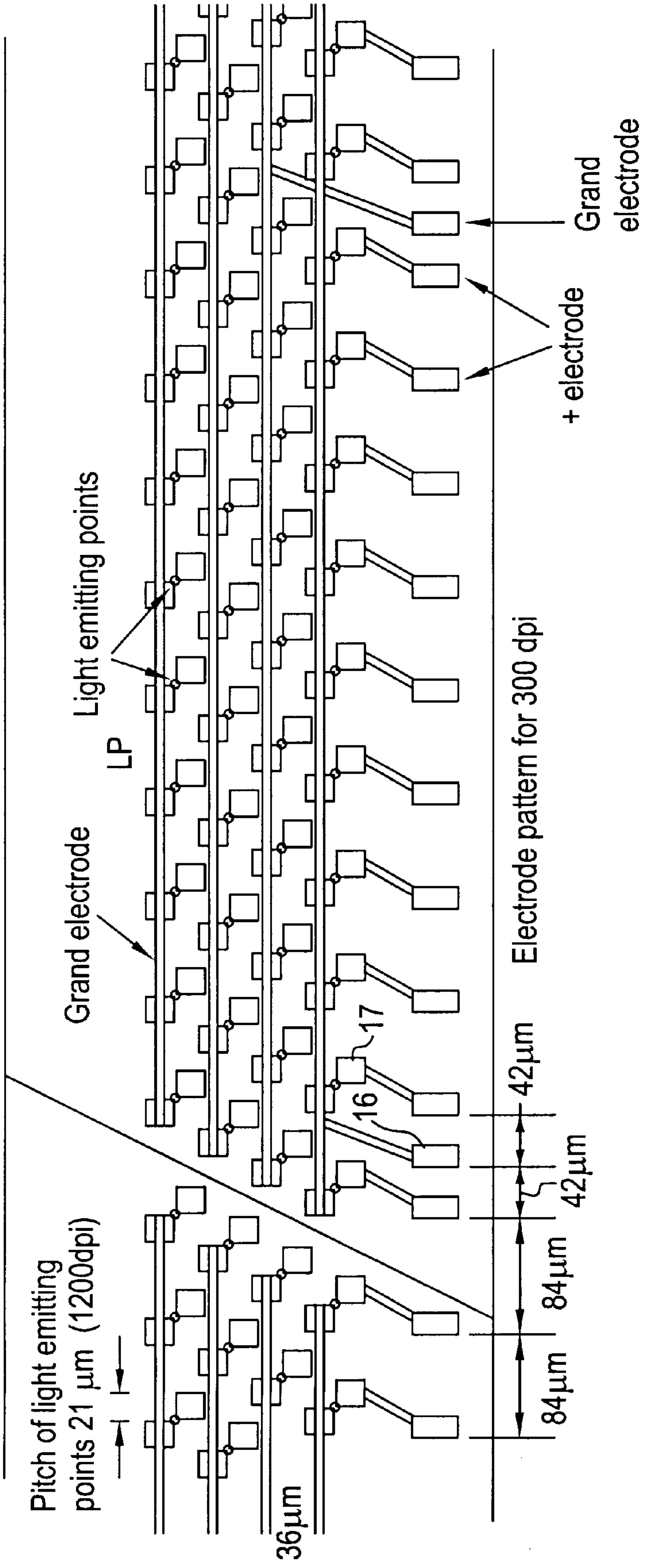
FIG. 5 illustrates a laser array of a second embodiment of the present invention.

FIG. 1 is a schematic view of a surface light-emitting type laser array apparatus used for the light equipment of the embodiment of the present invention; FIG. 2 is an enlarged schematic view of the apparatus, FIG. 3 is a schematic plan view of the apparatus; and FIGS. 4A and B are fragmentary cross-sectional and top views, respectively.

As shown in FIG. 1, in the laser array, chips separated in the form of a parallelogram so as to permit the device arrangement in which the first side is parallel to the main scanning direction are connected so that the second sides adjacent to the first side are opposed to the corresponding sides of the adjacent chip, respectively.

The laser array apparatus is formed by arranging n pieces of laser chips. Each laser chip comprises a laminated structure formed of a $2\times10^{18}/cm^3$ silicon-doped n-type GaAs substrate 1, a $3\times10^{18}/cm^3$ silicon-doped n-type GaAs buffer layer 2 which has been overlaid on the substrate 1 by the organometal chemical vapor deposition (MOCVD) and has a film thickness of 0.2 $\mu$m, a 3×1 silicon-doped n-type semiconductor multi-layered reflective film 3 overlaid on the buffer layer 2, a quantum well active layer 4 overlaid on the reflective film 3, a $3\times10^{18}/cm^3$ beryllium-doped p-type semiconductor multi-layered reflective film 5, and a $2\times10^{19}/cm^3$ GaAs contact layer which has been doped at a high concentration and has a film thickness of 10 nm; and can be obtained by forming a non-radiative region by implantation of proton, thereby forming an electrode pattern 6. On the apparatus, circular light emitting points LP having a diameter of 5 $\mu$m are arranged. As illustrated in an enlarged schematic view in FIG. 2, laser chips on which light emitting points have been arranged in one row along the main scanning direction and at the same time, arranged to be four rows in the subsidiary scanning direction (transferring direction) are arranged and connected so that the end surfaces S1 and S2 form an angle of 60 degrees relative to the main arranging direction (main scanning direction) of the light emitting points.

A detailed description will next be made in accordance with a process for fabricating the above-described laser array apparatus.

On the surface of the n-type GaAs substrate 1 formed of (100) n-type GaAs crystals doped with $2\times100^{18}/cm^3$ of silicon, the GaAs buffer layer 2 having a film thickness of 0.2 $\mu$m is formed by the organometal chemical vapor deposition (MOCVD). Upon growth, triethyl gallium (TEGa), triethyl aluminum (TEAl), triethyl indium (TEIn) and arsine ($ArH_3$) are used as raw material gases, the growth temperature is set at 650° C., the internal pressure of the reaction tube is reduced to $1\times10^{-4}$ Pa and the flow rate of all the gases including a hydrogen carrier gas is set at 4 liter/min. As impurities for doping, selenium hydride ($H_2Se$) and diethyl zinc (DEZ) are employed.

On the surface of the n-type GaAs buffer layer 2, an n-type semiconductor multi-layered reflective film 3 is formed. First, TEGa and $AsH_3$ under desired partial pressures are allowed to flow in the reaction tube of the MOCVD apparatus to let the GaAs layer grow. Then, the gases are changed without changing other conditions. Under desired partial pressures, $AsH_3$ and TEGa are fed to the reaction tube, whereby an $Al_{0.9}Ga_{0.1}As$ layer is formed. Next, TEGa, TEAl and $AsH_3$ are allowed to flow in the reaction tube of the MOCVD apparatus to cause a $Al_{0.3}Gao_{0.7}As$ layer to grow. A laminate composed of an $Al_{0.9}Ga_{0.1}As$ layer having a film thickness of 64.5 nm and an $Al_{0.3}Ga_{0.7}As$ layer having a film thickness of 57.6 nm is repeated by 40 cycles, whereby the n-type semiconductor multi-layered reflective film having a laminate structure is formed.

Then, TeGa, TEAl and $AsH_3$ are allowed to flow into the MOCVD apparatus at desired partial pressures and a laminate composed of an $Al_{0.30}Ga_{0.70}As$ layer having a film thickness of 5.0 nm, and an $Al_{0.11}Ga_{0.89}As$ layer having a film thickness of 8.0 nm is repeated by 4 cycles, which is sandwiched by an $Al_{0.60}Ga_{0.40}As$ layer having a film thickness of 89.8 nm, whereby an active layer 4 having a laminate structure is formed.

The gases are then changed in a similar manner. A laminate composed of an $Al_{0.9}Ga_{0.1}As$ layer having a film thickness of 64.5 nmand an $Al_{0.3}Ga_{0.7}As$ layer having a film thickness of 57.6 nm is repeated by 26 cycles, whereby a p-type semiconductor multi-layered reflective film 5 having a laminate structure is formed.

Then, a $2\times10^{19}/cm^3$ highly-doped GaAs contact layer 6c having a film thickness of 10 nm is formed. Finally, non-radiative region is formed by proton implantation and circular light emitting points LP each having a diameter of 5 $\mu$m are formed. As the arrangement pattern 6 of the light emitting points, the light emitting points are arranged in 4 rows so that they have a pitch of 21 $\mu$m in the main scanning direction and 36 $\mu$m in the subsidiary scanning direction. The pitch, in the main scanning direction, between the light emitting point on the first row and that on the fourth row at the place to be cut by a dicing machine is made larger than 21 $\mu$m. To allow electric current to flow in, a p-type electrode pattern 6 composed of an AuZn layer is formed. Here, a bonding pad BP is formed by drawing it on either side in the subsidiary scanning direction. Then, an AuGeNi layer is deposited all over reverse side of the GaAs substrate, whereby an n-type electrode 7 is formed.

The laser substrate so formed is cut by a dicing machine between the light emitting points on the first row and the fourth row in parallel with the arrangement direction of the light emitting points, whereby a chip in the form of a parallelogram is obtained. The distance from the end surface of the chip to the light emitting point is set at about 30 $\mu$m, the chip length in the main scanning direction is set at 5 mm and the chip width in the subsidiary scanning direction is set at 1 mm. Sixty pieces of so-obtained chips are adhered and connected on a ceramic plate by a die bonding machine and as a result, a laser array apparatus having a length of 300 mm is fabricated.

After connection of the chips, the distance between the light emitting points on the same row is set at 84 $\mu$m and the distance between the most proximate light emitting points of the adjacent chips is set at 72 $\mu$m, as illustrated in FIG. 3. This makes it possible to arrange light emitting points at a density as high as 21 $\mu$m in the longitudinal direction.

In the above-described embodiment, the chips are arranged in one straight line but a staggered arrangement can be attained by connecting the chips after carrying out parallel transfer of them in the subsidiary scanning direction of FIG. 2 or 3. In this case, the distance between the most proximate light emitting points of the adjacent chips can be widened further, which makes it possible to widen the margin between the end surface of the chip to be connected and the light emitting point.

A description will next be made of the second embodiment of the present invention.

In the above-described first embodiment, the p-type electrode is formed on the reverse side of the substrate, while in this second embodiment, both n-type electrode and p-type electrode are formed on the surface side of the substrate, on which matrix interconnection is conducted.

In a similar manner to the above-described embodiment until the implantation of proton for the formation of the light emitting points, a surface light-emitting laser is formed. Upon the formation of an electrode, the electrode existing in the lateral direction of the light emitting points LP is designated as a p-type electrode 17 and the electrode existing in the oblique direction is designated as an n-type electrode 16.

Upon fabrication of the laser, after each layer is formed and light emitting points are formed by proton implantation, rectangular etching is given in the vicinity of each light emitting point until the etching reaches the n-type semiconductor multi-layered reflective film. Then an AuGeNi film which will be the n-type electrode 16 is deposited thereon, followed by patterning.

A silicon nitride layer is then formed as an insulation layer by sputtering. Openings are then formed at a portion corresponding to the bonding pad of the n-type electrode and also a rectangular portion which is positioned on an opposite side of the above-described rectangular portion relative to the position of the light emitting points. Then, the p-type electrode 17 is formed so as to be in contact with the above-described rectangular portion.

The surface light-emitting array laser of matrix interconnection so formed is cut, as in the above Embodiment 1, so that the end surface will have an inclination (θ=60 degrees) relative to the light emitting points, whereby chips in the form of parallelogram are produced.

These chips are disposed on a ceramic substrate and they are adhered and connected with the substrate, whereby a laser array apparatus on which light emitting points have been arranged at high density in the longitudinal direction is fabricated.

The density of the light emitting points in this embodiment is similar to that in the above first embodiment but owing to the matrix interconnection of electrodes, the number of electrode interconnection can be reduced about one fourth of that of the first embodiment. This makes it possible to widen the interconnection space and to prevent the interconnection contact thereby bringing about a marked improvement in the yield.

A description will next be made of an optical equipment, which is formed using the laser array apparatus described in the above first embodiment or second embodiment, as the third embodiment of the present invention.

Figure 6:
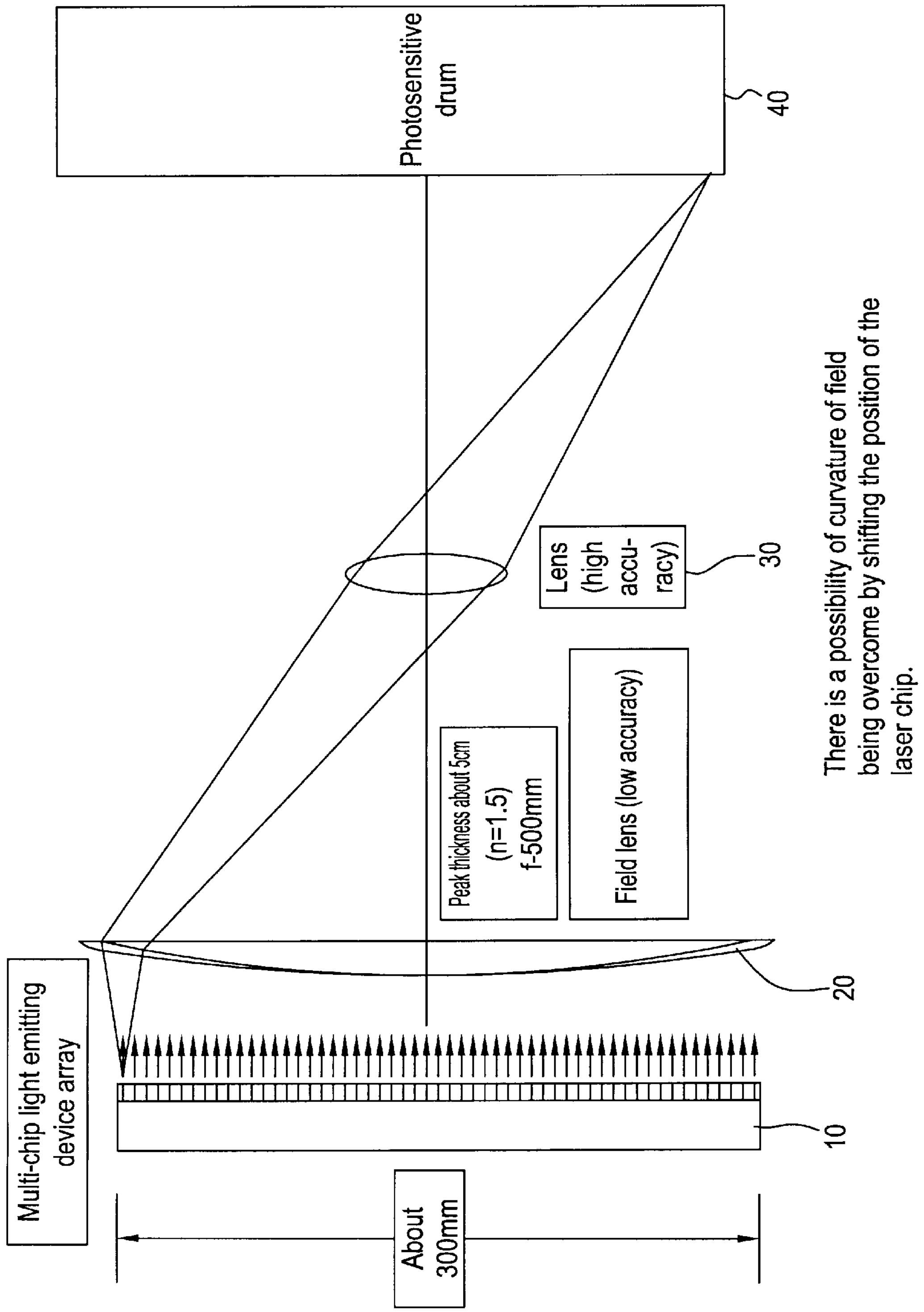
FIG. 6 illustrates an optical equipment of a third embodiment of the present invention.

As illustrated in FIG. 6, the light equipment is formed of the multi-chip laser array apparatus 10 formed in the above first embodiment 1; a field lens 20 which is disposed between the apparatus and a photosensitive drum 40 and introduces all the beams from the light emitting points into an image forming lens 30; and the image formation lens 30 which is disposed between the field lens 20 and the drum and forms an image on the photosensitive drum 40.

According to the above light equipment, it becomes possible to attain the high picture-quality printing having an image-formation-point density of 1200 dpi in the main scanning direction on the photosensitive drum at a magnification ratio of 1:1.

A description will next be made of an optical equipment, as the fourth embodiment of the present invention, which is formed using the laser array apparatus described in the above first or second embodiment.

Figure 7:
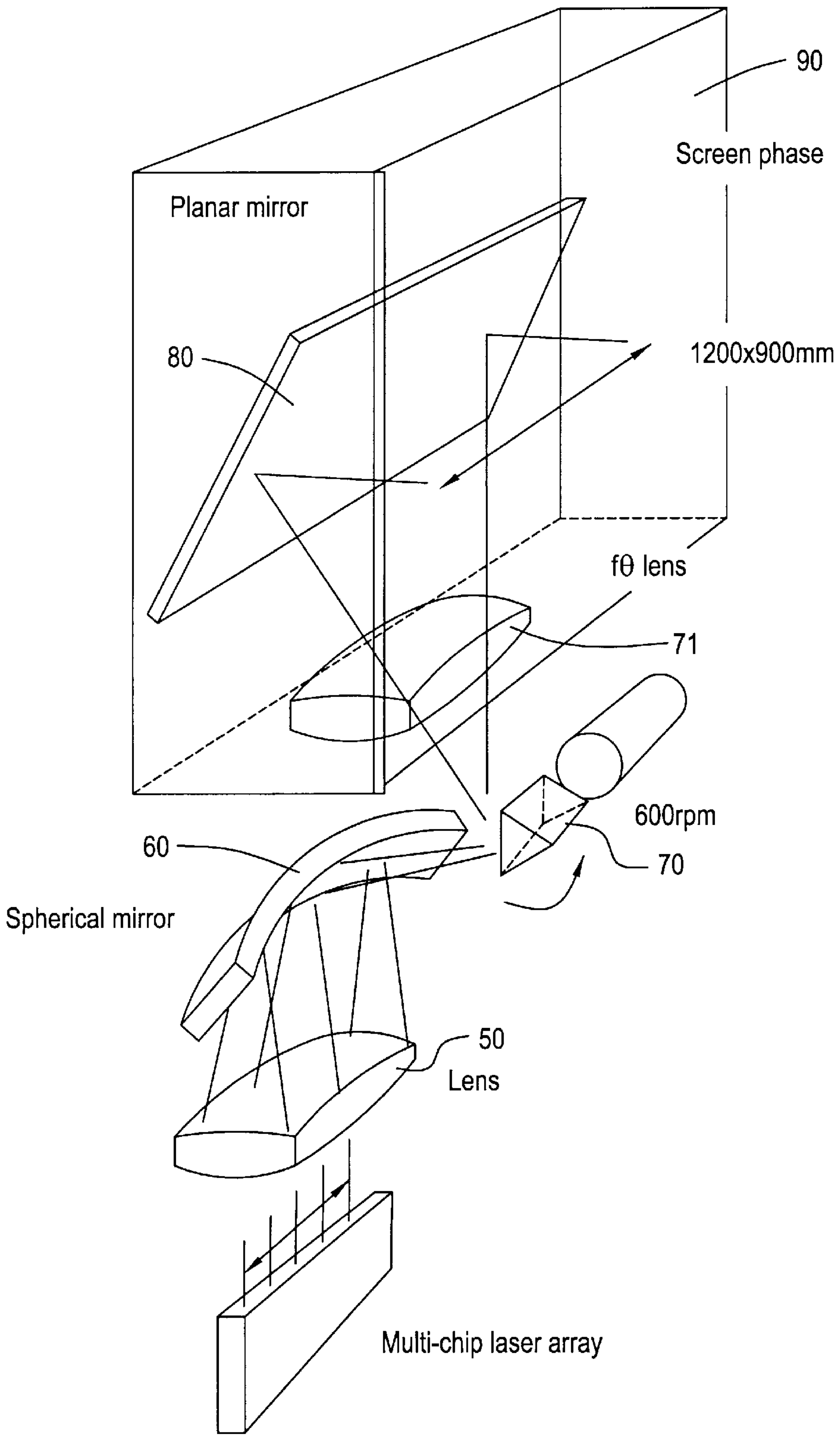
FIG. 7 illustrates an optical equipment of a fourth embodiment of the present invention.

As illustrated in FIG. 7, the optical equipment is constituted so that all the beams from the light emitting points are introduced to a field lens image-formation lens 50 which is disposed in the forward direction of the light emitting points, to a polygon mirror 70 through a spherical mirror 60, and then to a fθ lens 71. After being reflected on a planar mirror 80, they are finally introduced to a screen phase 90.

By the above equipment, a picture of high definition and saturation can be reflected easily on a large screen.

In the above embodiment, an example using only one multi-chip laser array was described, but it is needless to say that three kinds of multi-chip laser arrays which outgo radiation of red, green and blue colors, respectively can also be employed.

As the fifth embodiment of the present invention, a description will next be made of an example of forming a photo-detector array apparatus by connecting CCD photo-detector array chips formed on a silicon substrate.

Figure 8:
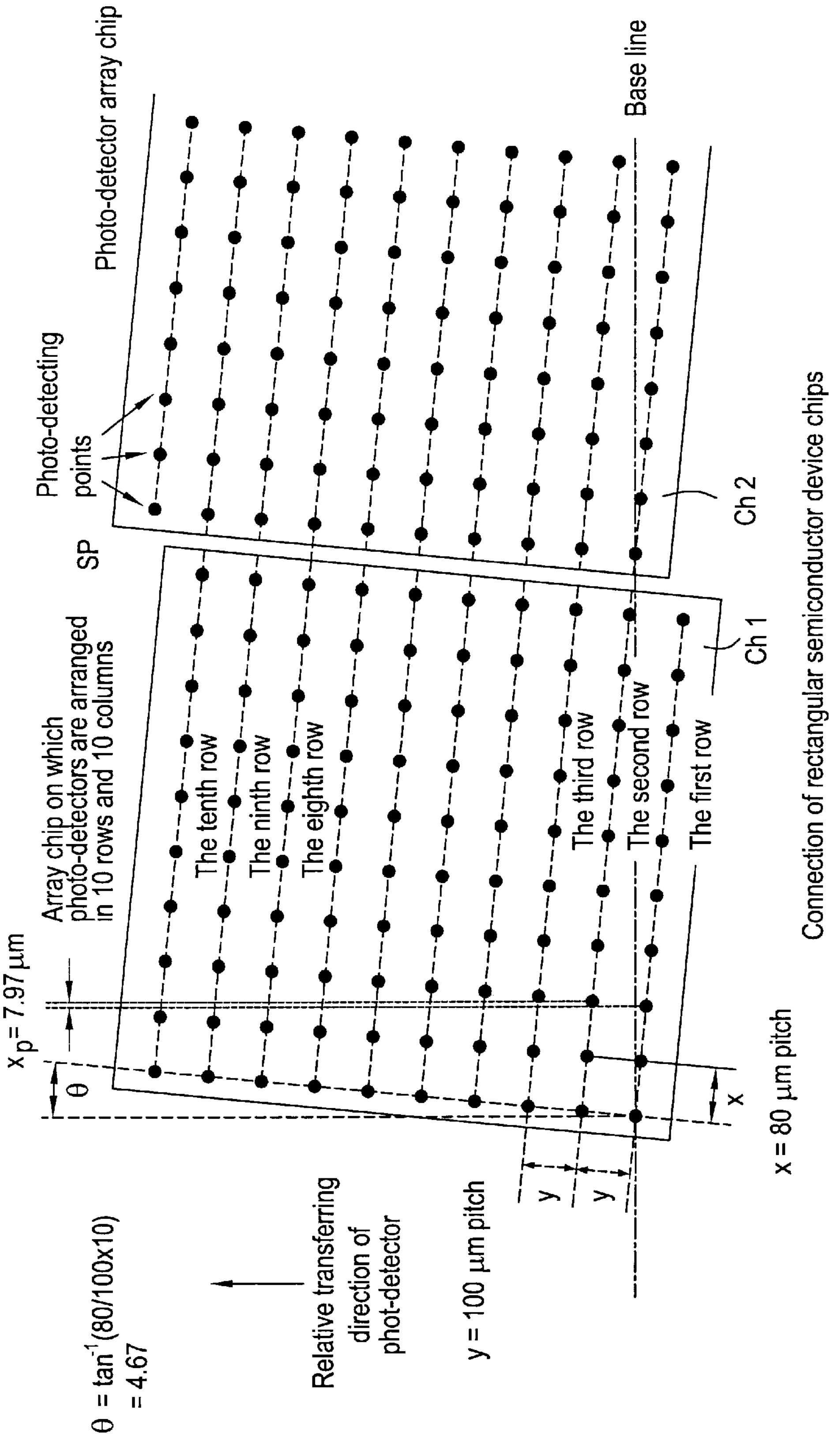
FIG. 8 illustrates a photo-detector array of a fifth embodiment of the present invention.

As illustrated in FIG. 8, in this photo-detector array apparatus, an array chip on which photo-detecting points SP are arranged regularly with 100 $\mu$m pitch (y) in the longitudinal direction and with 80 $\mu$m pitch (×) in the lateral direction to form a 10×10 lattice.

In this chip, the arranging direction of the photo-detecting points is vertical to an end surface of the chip. This photo-detector array chip is inclined at an angle θ (4.57) relative to the transferring direction of the photo-detector array chip to satisfy the following equation: $\theta = \tan^{-1}(8/100)$, followed by adhesion of five chips Ch1, Ch2 . . . successively on the ceramic substrate along the base line as shown in FIG. 8. According to such a constitution, the density of photo-detector in the direction of the base line is as high as 7.97 $\mu$m pitch. The distance between the most proximate photo-detecting points of the adjacent chips is 100 $\mu$m or 80 $\mu$m so that it is possible to widen the space between the end surface of the chip and the photo-detecting point. Here, the end surface of the chip exists on the perpendicular bisector of the line connecting the most proximate photo-detecting points.

It is possible to fabricate a multi-chip photo-detector array apparatus in which the distance between photo-detecting points at the chip connected surface is wide so that cutting or bonding can be carried out easily; and besides in which photo-detecting points are arranged at high density, by connecting rectangular chips, each having photo-detecting points regularly arranged in the lattice form, with an inclination.

Incidentally, the number of the rows arranged or pitch is not limited by the above-described embodiment and it can be changed as needed.

It is needless to say that in the above embodiment, a CCD photo-detector array chip is employed as photo-detecting means but amorphous silicon photo-detector, polycrystalline silicon photo-detector, or the like can also be used.

Figure 9A:
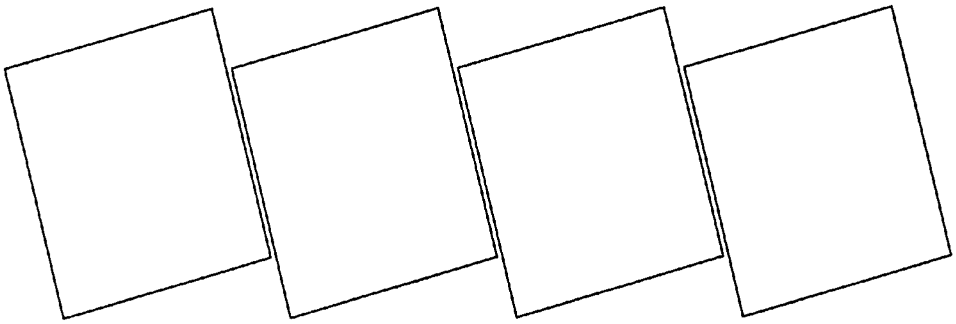
FIG. 9(*a*) and 9(*b*) illustrates the chip arrangement of a further embodiment of the present invention.
Figure 9B:
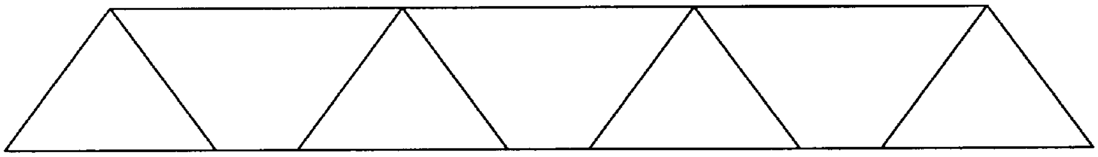

Incidentally, in the above-described embodiments, each chip is cut to have a parallelogram or rectangle, by which the present invention is not limited. It is also possible to have a rectangle or triangle as shown in FIGS. 9A or B.

Figure 10:
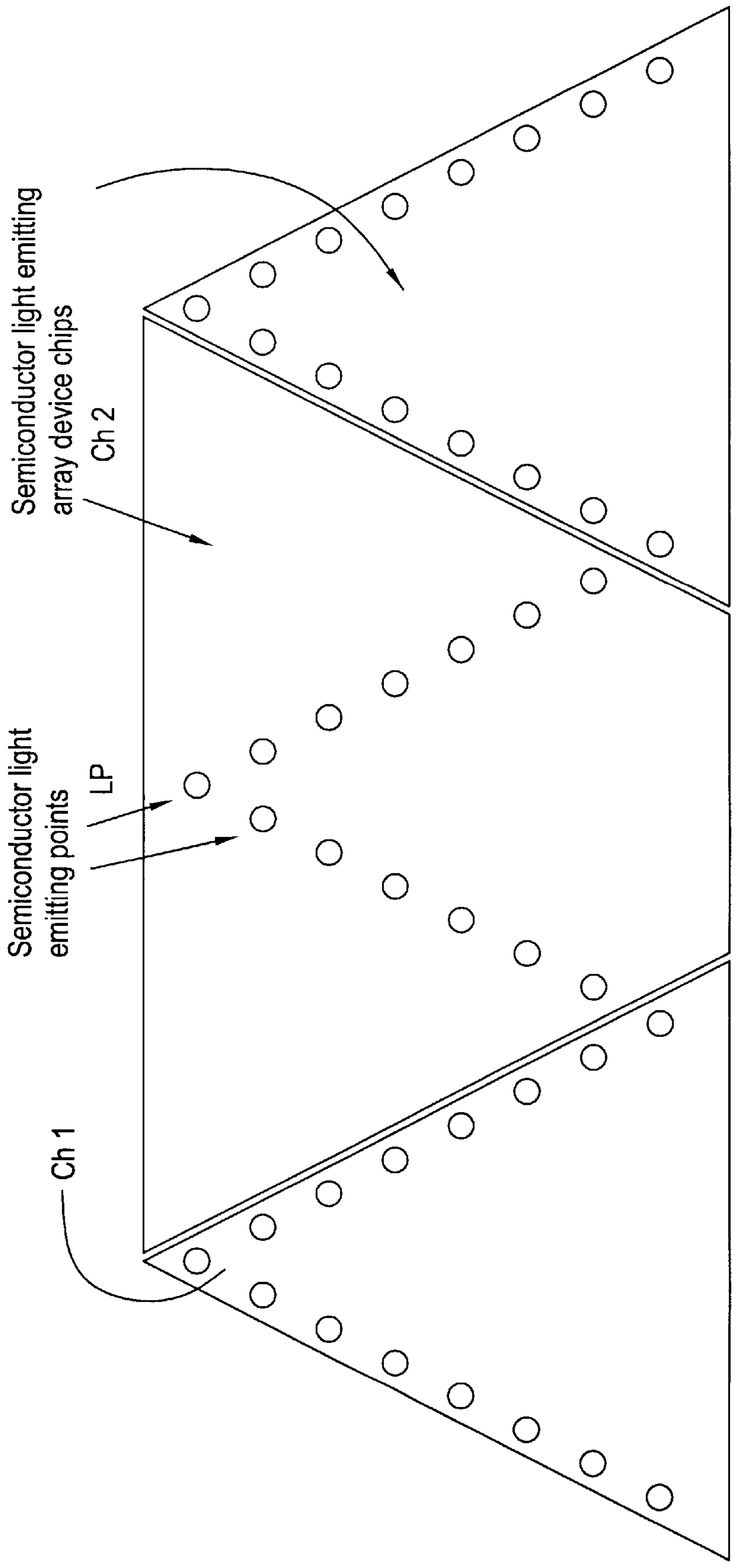
FIG. 10 illustrates light emitting points and the chip arrangement of a still further embodiment.
Figure 11:
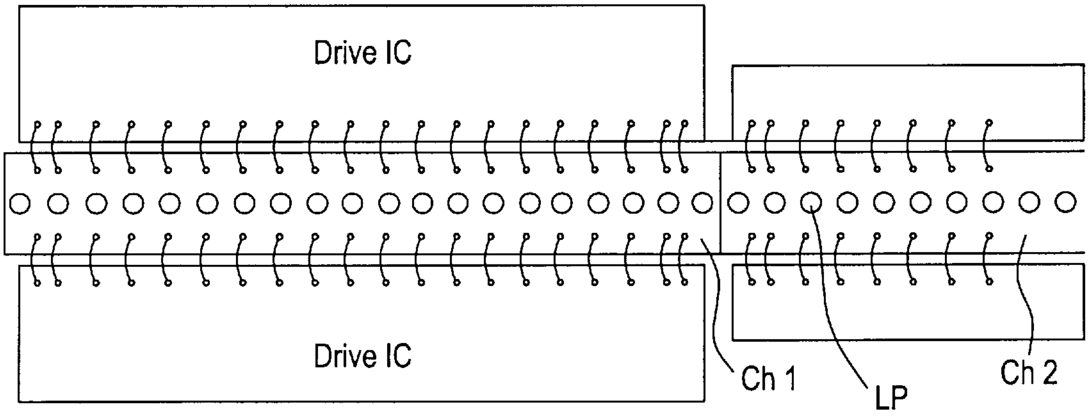
Fig. 11 (Related Art)
FIG. 11 illustrates a conventional light emitting device array for an optical equipment for LED printer.
Figure 12:
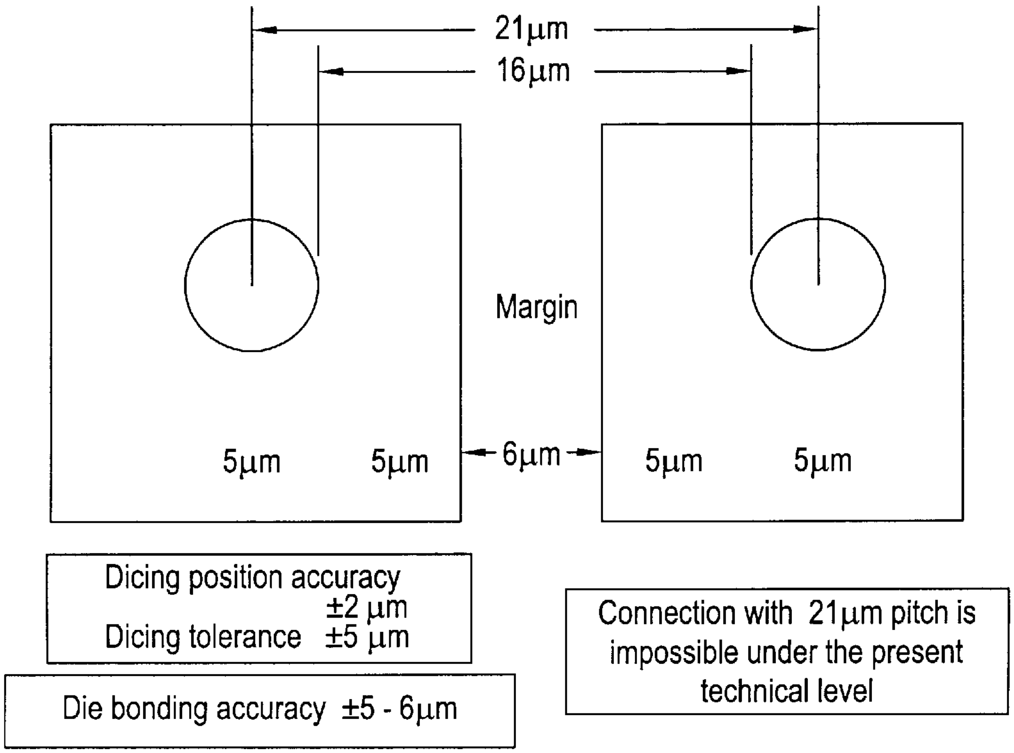
Fig. 12 (Related Art)
FIG. 12 illustrates a multi-chip array according to the conventional embodiment.

As shown in FIG. 10, a trapezoidal chip disposed between at least two triangular chips is also effective. In this embodiment, the remaining portion after cutting of a parallelogram-shaped chip from a circular semiconductor wafer can be used effectively by being cut into a triangular shape.

What is claimed is:

1. A semiconductor light-emitting device array which is to be used in light equipment, the light equipment also being equipped with photo-detecting means to which light is irradiated from said light-emitting device array and transferring means for transferring a position of the light irradiated from said light-emitting device array to a predetermined direction relative to said photo-detecting means, the semiconductor light-emitting device array comprising:

a plurality of semiconductor chips having end surfaces, said semiconductor chips being arranged adjacently at said end surfaces;

a plurality of light emitting portions formed on each of said semiconductor chips, said light emitting portions being arranged in a two-dimensional arrangement on each of said semiconductor chips such that at least one axis of said two-dimensional arrangement of light emitting portions has an oblique angle relative to said predetermined direction and each of said light emitting portions is non-aligned with each remaining light emitting portion in a direction perpendicular to said predetermined direction, said light emitting portions form a lattice of m-rows, wherein m is at least three; and end surfaces of adjacently disposed semiconductor chips are arranged oblique relative to said predetermined direction.

2. The semiconductor light-emitting device array according to claim 1, wherein said end surfaces of said adjacently arranged semiconductor chips are formed parallel to said at least one axis of said two-dimensional arrangement of light emitting portions.

3. The semiconductor light-emitting device array according to claim 1, wherein m is at least 4.

4. The semiconductor light-emitting device array according to claim 1, wherein said light emitting portions are arranged such that a straight line connecting a plurality of said light emitting portions adjacent to said end surfaces of said semiconductors is oblique relative to said predetermined direction.

5. Optical equipment, comprising:

a light-emitting device array;

a photo-receptor to which light is irradiated from said light-emitting device array; and transferring means for transferring a position of the light irradiated from said light-emitting device array to a predetermined direction relative to said photo-detecting means, wherein said light-emitting device array comprises a plurality of semiconductor chips having end surfaces, said semiconductor chips being arranged adjacently at said end surfaces, a plurality of light emitting portions formed on each of said semiconductor chips, said light emitting portions being arranged in a two-dimensional arrangement on each of said semiconductor chips such that at least one axis of said two-dimensional arrangement of light emitting portions has an oblique angle relative to said predetermined direction and each of said light emitting portions is non-aligned with each remaining light emitting portion in a direction perpendicular to said predetermined direction, said light emitting portions form a lattice of m-rows, wherein m is at least three, and end surfaces of adjacently disposed semiconductor chips are arranged oblique relative to said predetermined direction.

6. An optoelectric transducer array having a plurality of two-idimensionally arranged optoelectric transducing portions, said optoelectric transducer array comprising:

a plurality of semiconductor chips having end surfaces and said optoelectric transducing portions formed thereon in a predetermined direction, said semiconductor chips being arranged adjacently at said end surfaces;

a plurality of light emitting portions formed on each of said semiconductor chips, said light emitting portions being arranged in a two-dimensional arrangement on each of said semiconductor chips such that at least one axis of said two-dimensional arrangement of light emitting portions has an oblique angle relative to said predetermined direction and each of said light emitting portions is non-aligned with each remaining light emitting portion in a direction perpendicular to said predetermined direction, said light emitting portions form a lattice of m-rows, wherein m is at least three; and end surfaces of adjacently disposed semiconductor chips are arranged oblique relative to said predetermined direction.

* * * * *